US011124411B2

(12) United States Patent
Morabito et al.

(10) Patent No.: US 11,124,411 B2
(45) Date of Patent: Sep. 21, 2021

(54) MEMS ACTUATOR STRUCTURES RESISTANT TO SHOCK

(71) Applicant: MEMS Drive, Inc., Pasadena, CA (US)

(72) Inventors: Gerardo Morabito, Arcadia, CA (US);
Xiaolei Liu, South Pasadena, CA (US);
Guiqin Wang, Arcadia, CA (US);
Roman Gutierrez, Arcadia, CA (US);
Matthew Ng, Rosemead, CA (US)

(73) Assignee: MEMS Drive (Nanjing) Co., Ltd, Jiangsu (CN)

( * ) Notice: Subject to any disclaimer, the term of this patent is extended or adjusted under 35 U.S.C. 154(b) by 0 days.

(21) Appl. No.: 16/251,838

(22) Filed: Jan. 18, 2019

(65) Prior Publication Data
US 2019/0152764 A1 May 23, 2019

Related U.S. Application Data

(62) Division of application No. 14/985,175, filed on Dec. 30, 2015, now Pat. No. 10,196,259.

(51) Int. Cl.
*H02N 1/00* (2006.01)
*B81B 3/00* (2006.01)
*B81B 7/00* (2006.01)

(52) U.S. Cl.
CPC .......... *B81B 3/0051* (2013.01); *B81B 7/0016* (2013.01); *H02N 1/006* (2013.01);
(Continued)

(58) Field of Classification Search
CPC ................. B81B 3/0051; B81B 3/007; B81B 2203/0163; B81B 2203/0172;
(Continued)

(56) References Cited

U.S. PATENT DOCUMENTS 6,065,341 A 5/2000 Ishio et al.
6,360,605 B1 3/2002 Pinter et al.
(Continued)

FOREIGN PATENT DOCUMENTS

DE 19832906 C1 2/2000
EP 1170248 A2 1/2002
(Continued)

OTHER PUBLICATIONS

International Search Report issued in International Application No. PCT/US2016/067921 dated Mar. 2, 2017.
(Continued)

*Primary Examiner* — Edgardo San Martin
(74) *Attorney, Agent, or Firm* — Brian J. Colandreo; Michael T. Abramson; Holland & Knight LLP

(57) ABSTRACT

Shock-resistant MEMS structures are disclosed. In one implementation, a motion control flexure for a MEMS device includes: a rod including a first and second end, wherein the rod is tapered along its length such that it is widest at its center and thinnest at its ends; a first hinge directly coupled to the first end of the rod; and a second hinge directly coupled to the second of the rod. In another implementation, a conductive cantilever for a MEMS device includes: a curved center portion includes a first and second end, wherein the center portion has a point of inflection; a first root coupled to the first end of the center portion; and a second root coupled to the second end of the center portion. In yet another implementation, a shock stop for a MEMS device is described.

5 Claims, 11 Drawing Sheets

(52) U.S. Cl.
CPC . *B81B 2201/033* (2013.01); *B81B 2203/0118* (2013.01); *B81B 2203/0136* (2013.01); *B81B 2203/0163* (2013.01); *B81B 2203/055* (2013.01)

(58) Field of Classification Search
CPC .... B81B 2203/0136; B81B 2203/0145; B81B 7/0016; B81B 2201/033; H02N 1/008; H02N 1/006
See application file for complete search history.

(56) References Cited

U.S. PATENT DOCUMENTS

| | | | |
|---|---|---|---|
| 6,367,252 B1 | 4/2002 | Hill et al. | |
| 6,388,359 B1 * | 5/2002 | Duelli | G02B 6/357 310/309 |
| 6,546,801 B2 | 4/2003 | Orsier et al. | |
| 6,710,680 B2 * | 3/2004 | Niu | B81B 3/007 257/415 |
| 6,736,821 B2 | 5/2004 | Turner | |
| 6,911,891 B2 * | 6/2005 | Qiu | B81B 3/0051 337/53 |
| 7,013,730 B2 | 3/2006 | Malametz | |
| 7,019,231 B2 | 3/2006 | Ishikawa et al. | |
| 7,031,041 B2 * | 4/2006 | Mi | G02B 26/0841 359/213.1 |
| 7,075,209 B2 * | 7/2006 | Howell | B81C 99/006 200/181 |
| 7,205,867 B2 | 4/2007 | Lutz | |
| 7,266,272 B1 * | 9/2007 | Calvet | G02B 7/003 359/871 |
| 7,304,556 B2 | 12/2007 | Tamura | |
| 7,777,392 B2 * | 8/2010 | Chen | A61B 5/0062 310/306 |
| 7,800,280 B2 | 9/2010 | Jeong et al. | |
| 7,905,146 B2 | 3/2011 | Suzuki | |
| 8,307,710 B2 * | 11/2012 | Dwyer | G01P 15/132 73/514.39 |
| 8,662,468 B2 | 3/2014 | Hunnicutt | |
| 8,711,460 B2 * | 4/2014 | Ueda | B81B 3/007 16/277 |
| 8,712,229 B2 * | 4/2014 | Calvet | B81B 3/0037 396/75 |
| 8,810,023 B2 | 8/2014 | Koduri | |
| 8,947,797 B2 | 2/2015 | Calvet et al. | |
| 9,316,666 B2 | 4/2016 | Suzuki | |
| 9,446,937 B2 | 9/2016 | Akiba et al. | |
| 9,588,337 B2 | 3/2017 | Van Lierop et al. | |
| 9,621,775 B2 * | 4/2017 | Ng | H04N 5/2254 |
| 9,807,305 B2 * | 10/2017 | Gutierrez | G03B 3/10 |
| 9,869,691 B2 * | 1/2018 | Boisseau | F03G 3/00 |
| 9,914,639 B2 | 3/2018 | Duqi et al. | |
| 2002/0112538 A1 | 8/2002 | Pinter et al. | |
| 2003/0121260 A1 | 7/2003 | Sinclair | |
| 2004/0198063 A1 | 10/2004 | Subramanian et al. | |
| 2009/0025478 A1 | 1/2009 | Miki | |
| 2009/0180167 A1 | 7/2009 | Tani et al. | |
| 2009/0261517 A1 | 10/2009 | Yao | |
| 2011/0188104 A1 | 8/2011 | Tachibana et al. | |
| 2012/0120470 A1 | 5/2012 | Kitazawa et al. | |
| 2012/0140303 A1 | 6/2012 | Marxer et al. | |
| 2013/0019678 A1 | 1/2013 | Lazaroff et al. | |
| 2013/0077945 A1 | 3/2013 | Liu et al. | |
| 2013/0215525 A1 | 8/2013 | Wang et al. | |
| 2013/0264755 A1 | 10/2013 | Eskridge | |
| 2014/0363217 A1 | 12/2014 | Barrot et al. | |
| 2015/0241216 A1 | 8/2015 | Ahtee et al. | |
| 2015/0321900 A1 | 11/2015 | Liu et al. | |
| 2015/0334277 A1 | 11/2015 | Liu et al. | |
| 2017/0023606 A1 | 1/2017 | Naumann | |
| 2017/0082519 A1 | 3/2017 | Blomqvist et al. | |
| 2017/0190569 A1 | 7/2017 | Liu et al. | |
| 2017/0359003 A1 * | 12/2017 | Liu | H02N 2/028 |
| 2017/0373611 A1 | 12/2017 | Cottone et al. | |
| 2018/0155185 A1 * | 6/2018 | Grutzeck | B81B 3/0045 |
| 2019/0339301 A1 | 11/2019 | McNeil | |

FOREIGN PATENT DOCUMENTS

| | | | | |
|---|---|---|---|---|
| EP | 1542059 A1 | | 6/2005 | |
| JP | 2004202683 A | * | 7/2004 | |
| JP | 2009-236824 A | | 10/2009 | |
| KR | 20060034201 A | * | 4/2006 | ........... B81B 3/0051 |

OTHER PUBLICATIONS

International Search Report issued in International Application No. PCT/US2016/060547 dated Mar. 10, 2017.
Non-Final Office Action issued in U.S. Appl. No. 15/412,488 dated Jul. 20, 2017.
Non-Final Office Action issued in U.S. Appl. No. 14/985,175 dated Jun. 25, 2018.
Non-Final Office Action issued in related U.S. Appl. No. 16/251,933 dated Mar. 31, 2020.
EP Communication issued in related EP Application Serial No. 16882236.9 dated Dec. 3, 2019.
Office Action issued in related Japanese Application No. 2018-531611 dated Jan. 5, 2021.

* cited by examiner

MEMS ACTUATOR STRUCTURES RESISTANT TO SHOCK

RELATED CASES

This application is a divisional of U.S. application Ser. No. 14/985,175, filed on Dec. 30, 2015, entitled "MEMS Actuator Structures Resistant to Shock", the contents of which are herein incorporated by reference in its entirety.

TECHNICAL FIELD

The present disclosure relates generally to shock resistant structures for microelectromechanical systems (MEMS), and more particularly to shock resistant structures for MEMS actuators.

BRIEF SUMMARY OF THE DISCLOSURE

In accordance with various embodiments of the technology disclosed herein, shock-resistant MEMS device structures are disclosed. In one embodiment, a motion control flexure for a MEMS device includes: a rod comprising a first and second end, wherein the rod is tapered along its length such that it is widest at its center and thinnest at its ends; a first hinge directly coupled to the first end of the rod; and a second hinge directly coupled to the second of the rod. In various implementations of this embodiment, the rod may be between 1 and 4 mm long and between 10 and 70 µm wide, and each of the first and second hinges is between 0.05 and 0.3 mm long and between 1 and 10 µm wide. In particular implementations, the rod is about 50 µm wide at is center and about 35 µm wide at its first and second ends.

In another embodiment, a conductive cantilever for a MEMS device includes a curved center portion comprising a first and second end, wherein the center portion comprises a point of inflection; a first root coupled to the first end of the center portion; and a second root coupled to the second end of the center portion. In various implementations of this embodiment, the total length of the conductive cantilever may be between 4.5 and 7 millimeters, and the center portion may be between 0.012 and 0.030 millimeters wide. In one particular implementation of the conductive cantilever, each of the first and second roots is coupled to the center portion by a respective forked junction in a direction perpendicular to the length of the cantilever. In this implementation, the forked junction includes a plurality of parallel beams. In one embodiment, the forked junction includes a first tapered end coupled to a second tapered end in a direction perpendicular to the length of the cantilever.

In yet another embodiment, a shock stop for a MEMS device is between 0.250 and 1.000 millimeters wide and between 0.0250 and 1.200 millimeters long, and comprises a plurality of circular apertures with a diameter between 10 and 20 micrometers. In one implementation of this embodiment, the shock stop may be used in a MEMS actuator. In this embodiment, the MEMS actuator may include: an inner frame, the inner frame including the shock stop; and an outer frame coupled to the inner frame by a plurality of flexures, wherein the outer frame includes a corresponding shock stop configured to contact the shock stop in the event of a shock.

As used herein, the term "about" in quantitative terms refers to plus or minus 10%. For example, "about 10" would encompass 9-11. Moreover, where "about" is used herein in conjunction with a quantitative term it is understood that in addition to the value plus or minus 10%, the exact value of the quantitative term is also contemplated and described. For example, the term "about 10" expressly contemplates, describes and includes exactly 10.

Other features and aspects of the disclosure will become apparent from the following detailed description, taken in conjunction with the accompanying drawings, which illustrate, by way of example, the features in accordance with various embodiments. The summary is not intended to limit the scope of the invention, which is defined solely by the claims attached hereto.

BRIEF DESCRIPTION OF THE DRAWINGS

The disclosed technology, in accordance with one or more various embodiments, is described in detail with reference to the following figures. The drawings are provided for purposes of illustration only and merely depict typical or example embodiments of the disclosed technology. These drawings are provided to facilitate the reader's understanding of the disclosed technology and shall not be considered limiting of the breadth, scope, or applicability thereof. It should be noted that for clarity and ease of illustration these drawings are not necessarily made to scale.

The figures are not intended to be exhaustive or to limit the invention to the precise form disclosed. It should be understood that the invention can be practiced with modification and alteration, and that the disclosed technology be limited only by the claims and the equivalents thereof.

DETAILED DESCRIPTION

In accordance with various embodiments of the disclosed technology, shock-resistant MEMS device structures are disclosed. More particularly, FIGS. 1-4 illustrate MEMS actuators for moving an optoelectronic device that may implement shock-resistant MEMS structures in accordance with particular embodiments of the technology disclosed herein. In implementations, the shock-resistant structures described herein may reduce load on the MEMS actuator and resist deformation during events (e.g., dropping the MEMS actuator) that may cause shock to the MEMS actuator. It should be noted that although the shock resistant MEMS actuator structures will be described primarily with reference to the example MEMS actuators of FIGS. 1-4, one having skill in the art would appreciate that the shock-resistant structures could be implemented in other MEMS apparatuses including moving parts that may be subject to shock events.

Figure 1A:
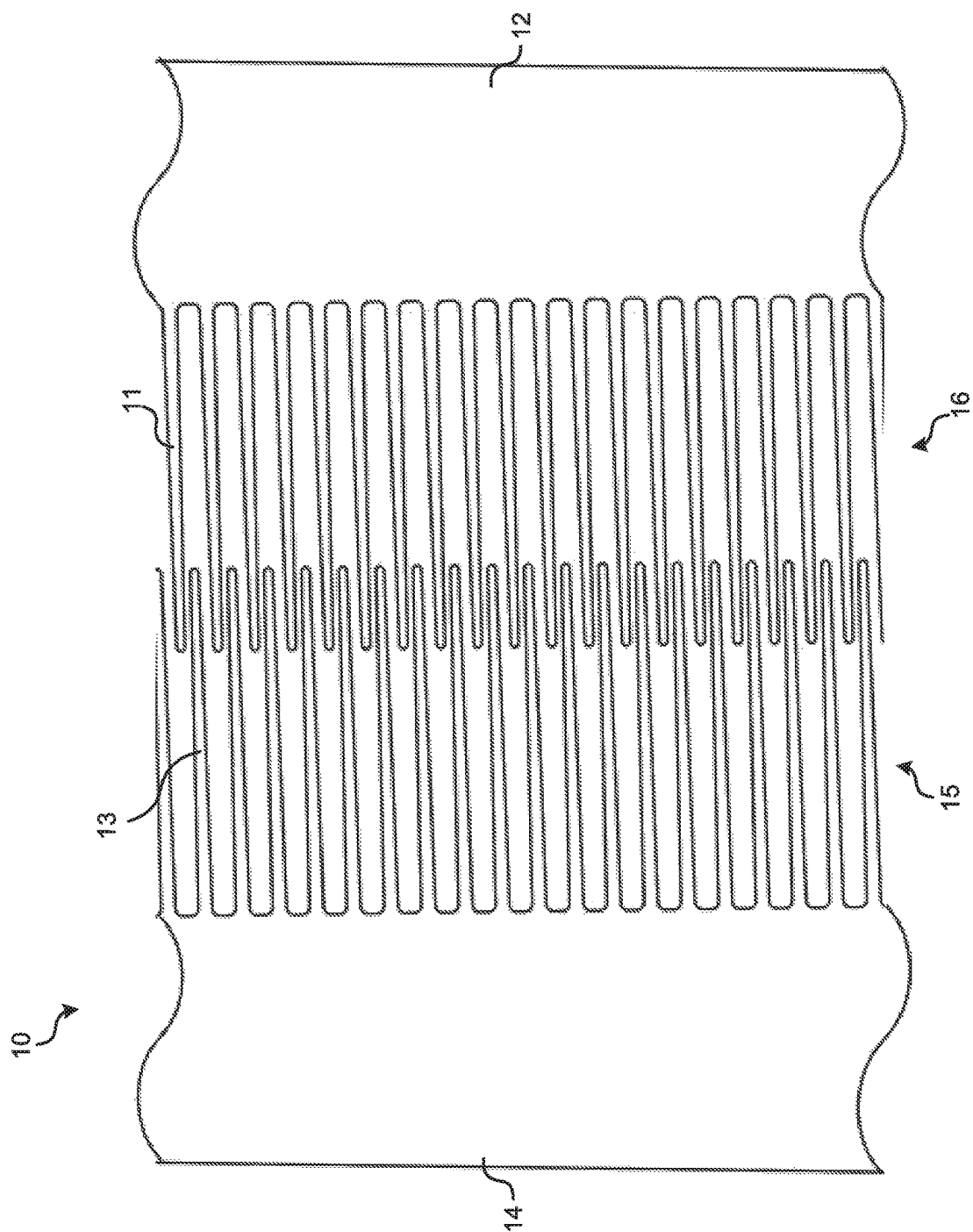
FIG. 1A illustrates a plan view of a comb drive in accordance with example embodiments of the disclosed technology.
Figure 1B:
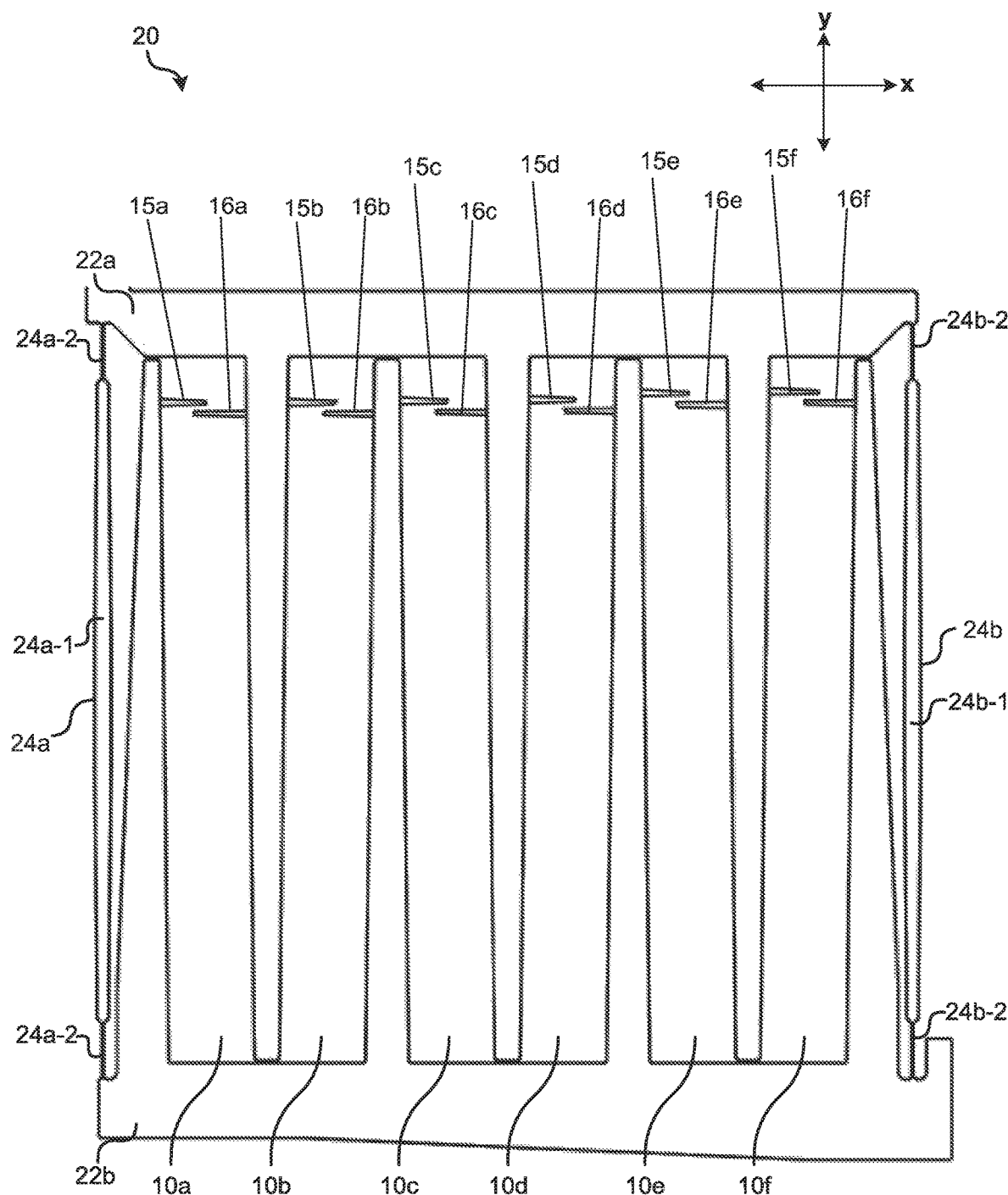
FIG. 1B illustrates a plan view of a bidirectional comb drive actuator including six of the comb drives of FIG. 1A that may use shock-resistant motion control flexures in accordance with embodiments of the disclosed technology.

FIGS. 1A-1B illustrate plan views of a comb drive 10 and bidirectional comb drive actuator 20 including six comb drives 10a-f in accordance with example embodiments of the present disclosure. As illustrated in FIG. 1A, each comb drive 10 includes comb finger arrays 15 and 16. Each comb finger array 15 and 16 includes a respective spine (14, 12) and plurality of comb fingers (13, 11).

Figure 1C:
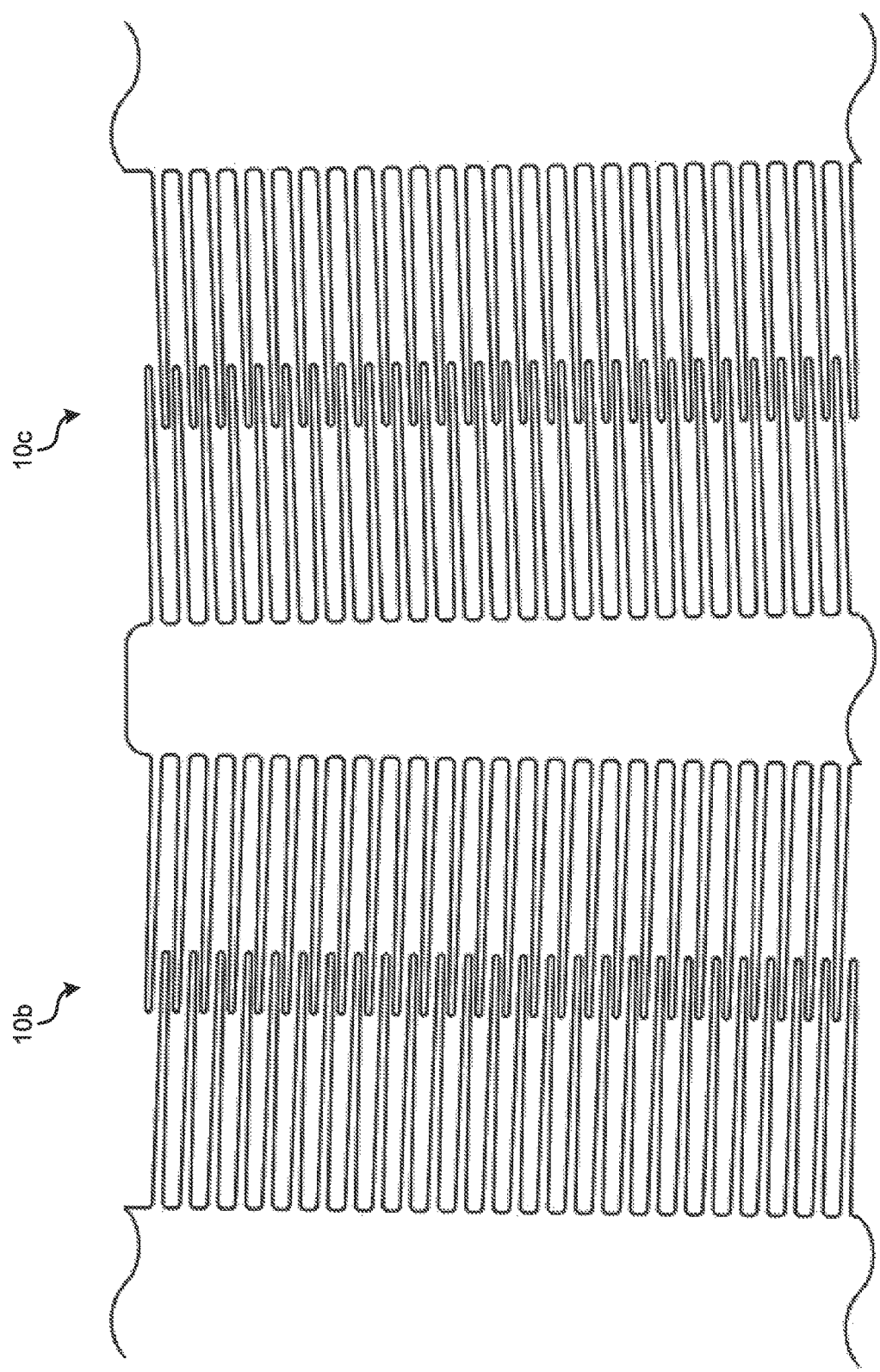
FIG. 1C is a magnified view of a first comb drive coupled to a second comb drive in accordance with embodiments of the disclosed technology.

Bidirectional Comb drive actuator 20 includes first and second frame pieces 22a-22b, and first and second motion control flexures 24a-24b. Although not shown in detail in FIG. 1B, it will be understood that, as shown in FIG. 1A, for each comb drive 10a-f, comb fingers 11 and 13 extend substantially from left to right, and vice versa, in comb finger arrays 15a-f and 16a-f. Moreover, it will be understood that spines 12 and 14 run substantially vertically from first frame piece 22a to second frame piece 22b, i.e., substantially in parallel with motion control flexures 24a-24b. This is illustrated by FIG. 1C, which shows a first comb drive 10b coupled to a second comb drive 10c.

As illustrated in this embodiment, spine 14 is attached to second frame piece 22b, while spine 12 is attached to first frame piece 22a. During operation, as comb finger arrays 15 and 16 of each comb drive 10a-10f are attracted to or repelled from one another by electrostatic forces, movement occurs such that first frame piece 22a likewise moves in a direction when the second frame is fixed (e.g., in the positive X direction in FIG. 1B). One of skill in the art will appreciate, upon studying the present disclosure, that electrostatic forces and other motive forces may be developed between each pair of comb finger arrays 15 and 16 by methods other than applying voltage, without departing from the spirit of the present disclosure. For example, charge may be applied to comb finger arrays 15 and 16.

In various embodiments, spines 12 and 14 and first and second frame pieces 22a and 22b may be dimensioned wide and deep enough to be rigid and not flex substantially under an applied range of electrostatic or other motive forces. For example, in particular embodiments spines 12 and 14 may be about 20 to 100 micrometers wide and about 50 to 250 micrometers deep, and first and second frame pieces 22a and 22b may be larger than about 50 micrometers wide and about 50 to 250 micrometers deep.

In one embodiment, during operation of comb drive actuator 20, when comb finger arrays 15a and 16a are electrified (e.g., in the manner described above), a motive force is applied with respect to first and second frame pieces 22a-22b such that either first or second frame piece 22a-22b moves substantially horizontally from an initial position with respect to second or first frame piece 22a-22b, depending upon which of first and second frame piece 22a-22b is mechanically fixed. Once comb finger arrays 15a and 16a are no longer electrified, first or second frame pieces 22a-22b move back to the initial state due to the spring restoring force of first and second motion flexures 24a and 24b. Further to this implementation, movement in a substantially opposite direction is achieved (e.g., in the opposite X direction in FIG. 1B), in addition to the movement resulting from comb drive 10a, when comb finger arrays 15c and 16c of comb drive 10c are electrified. Likewise, bidirectional movement in these two directions (i.e., positive and negative X direction in the drawing) may be achieved by electrifying the comb finger arrays of comb drives 10b, 10d, and 10e-f.

In various embodiments, spines 12 and 14 of comb finger arrays 15a-f and 16a-f may be attached to first and/or second frame pieces 22a-b in different configurations to achieve different purposes. For example, in one embodiment, for each comb drive 10a-10f, spine 12 is attached to first frame piece 22a while spine 14 is attached to second frame piece 22b. Such a configuration results in a parallel cascade of comb drives 10a-f that may increase the electrostatic force ultimately applied to first and second frame pieces 22a-b. In another example embodiment, comb drives 10a-10f are arranged in a back-to-back fashion to achieve bidirectional movement, as described above. While this back-to-back arrangement was described above with regard comb drives 10a-f—i.e., six comb drives 10—a different number of comb drives may be used to achieve bidirectional movement.

In one embodiment, a comb finger array, for example, 16a, 16c, 16e or 15b, 15d, 15f of each comb drive 10a-10f may be tied to a common potential (e.g., ground or some other positive or negative voltage) that acts as a reference for the other three comb finger arrays. Given this reference, the comb finger arrays that are not tied to a common potential may be electrified depending upon the direction of movement required.

For example, consider an embodiment where comb finger arrays 15a, 16b, 15c, 16d, 15e and 15f of comb drives 10a-10f are tied to a common ground. In this embodiment, movement of comb drive actuator 20 may be effectuated by applying a positive or negative voltage (e.g., relative to ground or other common reference) to comb finger array 16a, hence causing comb finger array 16a to be attracted to comb finger array 15a. Assuming second frame piece 22b is fixed, this attraction would, in this example, cause first frame piece 22a to move to the left in FIG. 1B. Further to this illustration, electrifying comb finger array 15b may entail applying thereto a positive or negative voltage 15b, hence causing comb finger array 15b to be attracted to comb finger array 16b. This attraction would, in this instance, cause first frame piece 22a to move to the right in FIG. 1B, assuming again that second frame piece 22b is fixed.

In further embodiments, the motive force developed by a comb drive 10a may differ from the motive force developed by another comb drive 10b-10f. For example, voltages of different magnitudes may be applied to some or all of comb finger arrays 15b, 15d, and 15f, or whichever comb finger arrays are not tied to a common potential. In some embodiments, for comb finger arrays 15b, 15d, and 15f to maintain different voltage levels, or electrostatic or charge states, the comb finger arrays may be electrically separate (or isolated) from one another.

The movement of first or second frame pieces 22a-22b and comb finger arrays 15a-f or 16a-f of each comb drive 10a-10f may be directed and/or controlled to some extent by first and second motion control flexures 24a-24b. In this particular embodiment, for example, first and second motion control flexures 24a-24b are substantially flexible or soft in the horizontal direction (i.e., in the direction of comb fingers 11 and 13) and substantially stiff or rigid in the vertical direction (i.e., in the direction of spines 12 and 14). Accordingly, first and second motion control flexures 24a-24b allow comb drive 10 to effect bidirectional movement horizontally (i.e., in the X direction FIG. 1B) while substantially restricting the movement in the vertical direction (i.e., in the Y direction in FIG. 1B).

The arrangement of first and second motion control flexures 24a-24b may be referred to, in some embodiments, as a double parallel flexure motion control. Such a double parallel flexure motion control may produce nearly linear motion, but there may be a slight run-out known as arcuate motion. Nevertheless, the gap on one side of comb fingers 11 may not be equal to the gap on the other side of comb fingers 11, and this may be used advantageously in design to correct for effects such as arcuate motion of a double parallel flexure motion control. In embodiments, additional structures may be used to control the motion of first and second frame pieces 22a-22b with respect to one another.

In the illustrated embodiment, first and second flexures 24a-24b include thinner portions 24a-2 and 24b-2 on the respective ends thereof. These thinner portions may allow bending when, for example, there is a translation of first frame piece 22a with respect to second frame piece 22b or vice versa (i.e., in the X direction in FIG. 1B). In embodiments, thinner portions 24a-2 and 24b-2 may be shaped as Y-junctions to add flexibility that permits motion in the X direction. In embodiments, the thicker portion 24a-1 and 24b-1 of first and second flexures 24a and 24b may be dimensioned to be about 10 to 50 micrometers (μm) wide (i.e., width in x direction of FIG. 1B), and the thinner portions 24a-2 and 24b-2 may be dimensioned to be about 1 to 10 μm wide. In various embodiments, any number and type of motion controls may be used as desired to control or limit the motion of comb finger arrays 15 or 16. Controlled motion may enhance the overall precision with which comb drive actuator 20 effects movement, or positions a device such as, for example, an image sensor in a smartphone camera. In addition, controlled motion aids in avoiding a situation in which comb fingers 11 and 13 snap together. For example, controlled motion may generally be effected by creating a lower level of stiffness in desired direction of motion of comb fingers 15 and 16, while creating a higher level of stiffness in the direction orthogonal to the motion of comb fingers 15 and 16 in the plane of comb drive actuator 20. By way of example, this may be done using a double parallel flexure type motion control.

In various embodiments, motion control flexures 24a and 24b may be designed to improve the shock performance of a MEMS actuator device. In such embodiments, motion control flexures 24a and 24b may be designed to absorb a force or load during a shock event (e.g., dropping a device containing the MEMS actuator). For example, in particular embodiments, motion control flexures 24a and 24b may be designed to absorb the inertial load due to a motion stage for the MEMS actuator (not illustrated) and at least one of the three comb array pairs (10a, 10c, 10e), and (10b, 10d, 10f). In specific implementations of these embodiments, this inertial load may be between 200 and 800 mN.

Figure 1D:
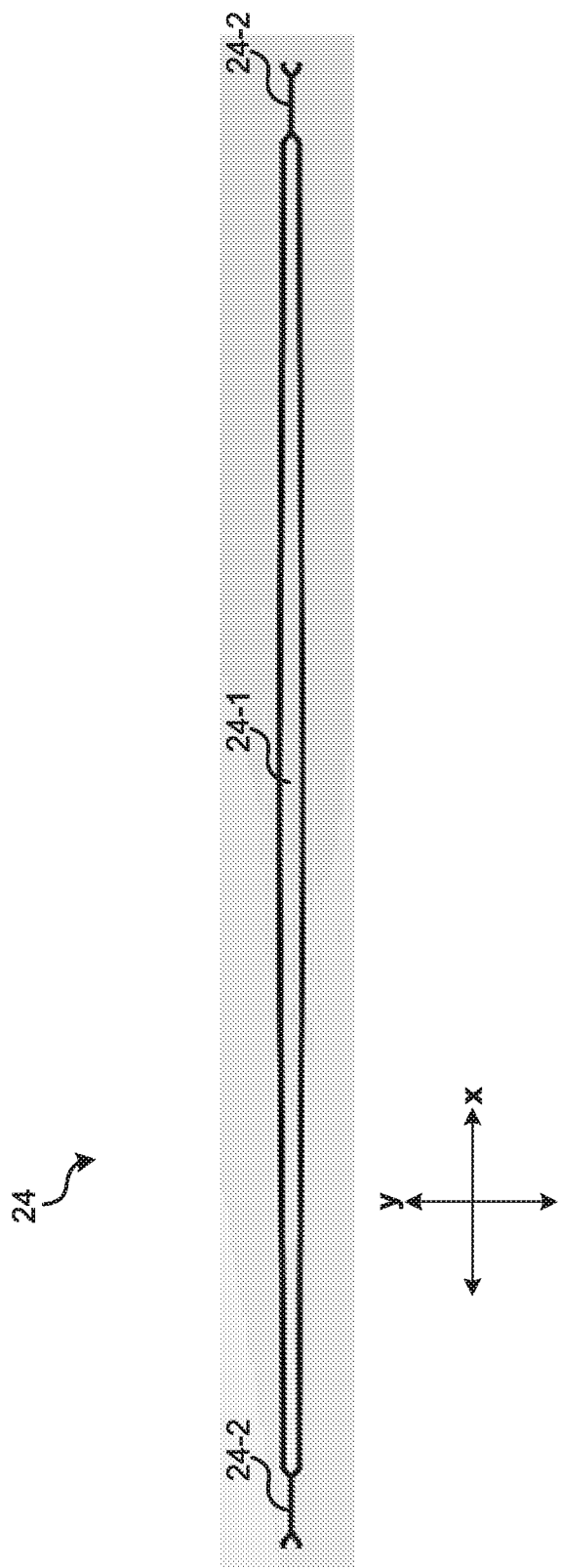
FIG. 1D illustrates a tapered motion control flexure for an actuator that may be used in embodiments to absorb an inertial load during shock events.

FIG. 1D illustrates a particular design for a tapered motion control flexure 24 that may be used in embodiments to absorb an inertial load during shock events. In embodiments, motion control flexure 24 may absorb a loading force between 100 and 400 mN before entering a buckled state (i.e., before deforming).

As shown, motion control flexure 24 includes two thin, soft hinges 24-2 and a wide, stiff rod 24-1 connecting the two hinges. In embodiments, rod 24-1 may be between 1 and 4 millimeters (mm) long in the x direction and between 10 and 50 μm wide in the y direction. In embodiments, hinges 24-2 may be between 0.05 and 0.3 mm long in the x direction and between 1 and 10 μm wide in the y direction. In these embodiments, the dimensions of hinges 24-2 may be optimized to achieve a required stiffness or to avoid buckling. As shown in this particular embodiment, rod 24-1 is tapered along its length such that it is widest at its center and thinnest at it ends. This tapered design, in some embodiments, permits motion control flexure 24 to absorb a larger loading force before entering a buckled state. In particular implementations of this embodiment, tapered rod 24-1 may be between 35 and 50 μm wide at its center and between 20 and 40 μm wide at its ends. In one particular embodiment, stiff-rod 24-1 is about 50 μm wide at its center, about 35 μm wide at its end, and capable of absorbing an inertial load of about 280 mN before buckling. In alternative embodiments, stiff-rod 24-1 may be uniformly wide along its entire length.

Figure 2A:
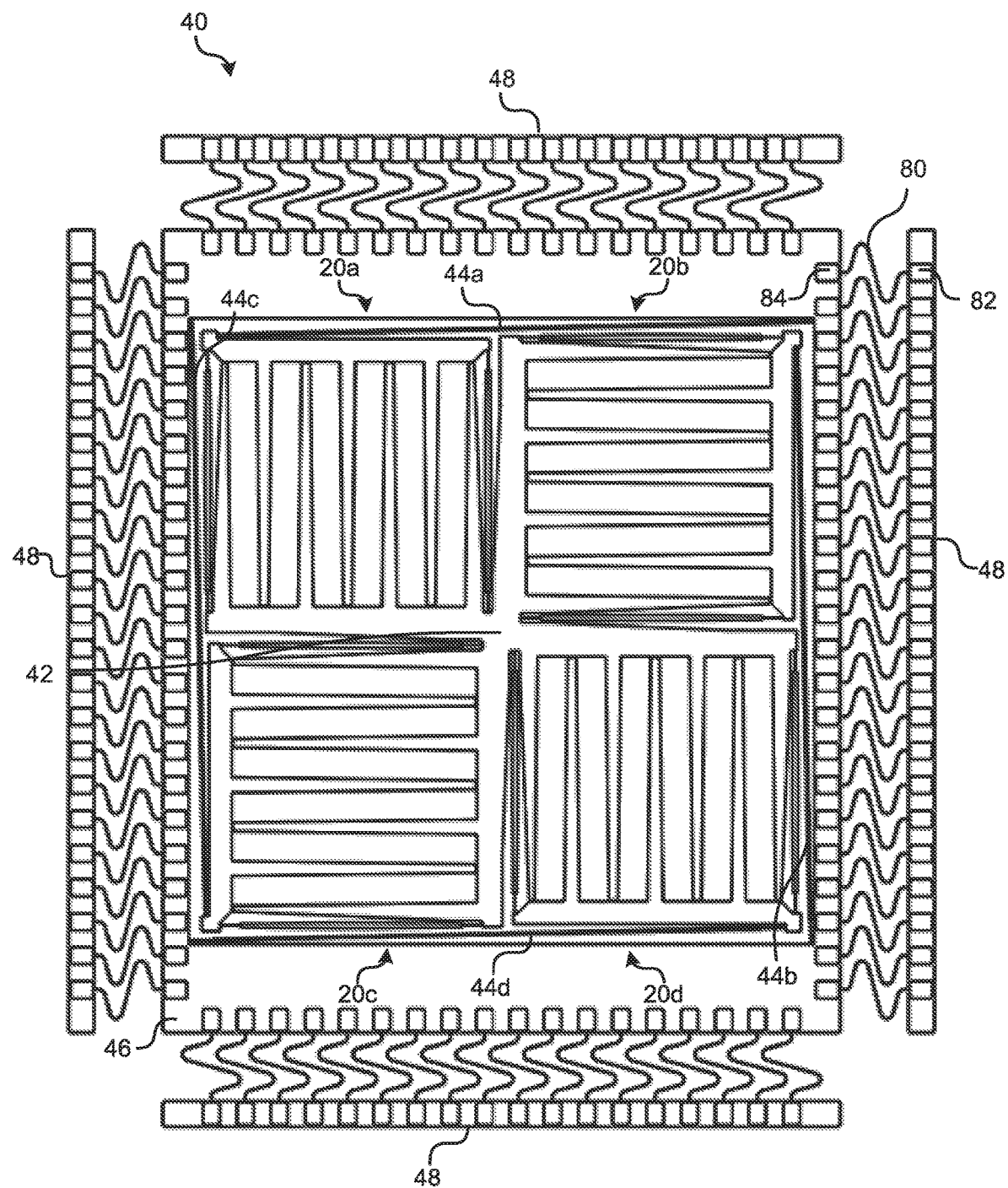
FIG. 2A illustrates a plan view of an MEMS actuator in accordance with example embodiments of the disclosed technology.

FIG. 2A illustrates a plan view of an example MEMS multi-dimensional actuator 40 in accordance with example embodiments of the present disclosure. As illustrated in this embodiment, actuator 40 includes an outer frame 48 (divided into four sections) connected to inner frame 46 by one or more spring elements or flexures 80, four bidirectional comb drive actuators 20a-d, and one or more cantilevers 44a-d including a first end connected to one end of comb drive actuators 20a-d and a second end connected to inner frame 46. Although FIG. 2A illustrates an example actuator 40 including four comb drive actuators 20, in other embodiments, actuator 40 may include a different number of comb drive actuators 20.

In embodiments, actuator 40 includes an anchor 42 that is rigidly connected or attached to first and/or second frame pieces 22a-22b of one or more comb drive actuators 20, such that anchor 42 is mechanically fixed with respect thereto. Thus, for example, if first frame piece 22a is attached to anchor 32, movement of second frame piece 22b relative to first frame piece 22a may also be considered movement relative to anchor 42.

During operation of actuator 40, comb drive actuators 20a-d may apply a controlled force between inner frame 46 and anchor 42. One or more comb drive actuators 20a-d may be rigidly connected or attached to anchor 42, and anchor 42 may be mechanically fixed (e.g., rigidly connected or attached) with respect to outer frame 48. In one embodiment, a platform is rigidly connected or attached to outer frame 48 and to anchor 42. In this manner, the platform may mechanically fix outer frame 48 with respect to anchor 42 (and/or vice versa). Inner frame 46 may then move with respect to both outer frame 48 and anchor 42, and also with respect to the platform. In one embodiment, the platform is a silicon platform. The platform, in various embodiments, is an optoelectronic device, or an image sensor, such as a charge-coupled-device (CCD) or a complementary-metal-oxide-semiconductor (CMOS) image sensor.

In embodiments, the size of actuator 40 may be substantially the same as the size as the platform, and the platform may attach to outer frame 48 and anchor 42, thus mechanically fixing anchor 42 with respect to outer frame 48. In another embodiment of actuator 40, the platform is smaller than actuator 40, and the platform attaches to inner frame 46. In this particular embodiment, outer frame 48 is fixed (or rigidly connected or attached) relative to anchor 42, and inner frame 46 is moved by the various comb drive actuators 20a-d.

In one embodiment, two comb drive actuators 20a and 20d actuate along a first direction or axis in the plane of actuator 40 (e.g., east/west, or left/right), and two comb drive actuators 20b and 20c actuate along a second direction or axis in the plane of actuator 40 (e.g., north/south, or top/bottom). The first and second directions may be substantially perpendicular to one another in the plane of actuator 40.

Various other configurations of comb drive actuators 20a-d are possible. Such configurations may include more or less comb drives 10 in each of the comb drive actuators 20a-d, and various positioning and/or arrangement of comb drive actuators 20a-d, for example, to enable actuation in more or less degrees of freedom (e.g., in a triangular, pentagonal, hexagonal formation, or the like).

In embodiments, cantilevers 44a-d are relatively stiff in the respective direction of motion of the respective comb drive actuators 20a-d, and are relatively soft in the in-plane orthogonal direction. This may allow for comb drive actuators 20a-d to effect a controlled motion of inner frame 46 with respect to anchor 42 and hence with respect to outer frame 48. In embodiments, illustrated by FIG. 2A, outer frame 48 is not continuous around the perimeter of actuator 40, but is broken into pieces (e.g., two, three, four, or more pieces). Alternatively, in other embodiments, outer frame 48 may be continuous around the perimeter of actuator 40. Similarly, inner frame 46 may be continuous or may be divided into sections.

In various embodiments, electrical signals may be delivered to comb drive actuators 20a-d via routing on or in cantilevers 44a-d. In some instances, two or more different voltages may be used in conjunction with comb drive actuator 20a. In such instances, two electrical signals may be routed to comb drive actuator 20a via first and second conductive layers 45 and 47, respectively, of cantilever 44a. Once delivered to comb drive actuator 20a, the two electrical signals may be routed, for example, via first frame piece 22a, to comb finger arrays 16a and 15b, respectively.

In another example implementation of actuator 40, two electrical signals used to develop motive forces in comb drive actuator 20b may also be used to develop similar motive forces in comb drive actuator 20c. In such an implementation, rather than routing these two electrical signals to comb drive actuator 20c through cantilever 44c, the two electrical signals may be routed to comb drive actuator 20c from comb drive actuator 20b. By way of example, this may entail routing the two electrical signals from an electrical contact pad 84, through cantilever 44b to a first frame piece 22a of comb drive actuator 20b. In addition, the two electrical signals may be routed from first frame piece 22a via flexures 24a-b (respectively) and second frame piece 22b to anchor 42. The two electrical signals may then be routed through anchor 42 to comb drive actuator 20c. It will be appreciated that various routing options may be exploited to deliver electrical signals to comb drive actuators 20a-d. For example, multiple routing layers may be utilized in anchor 42, in first or second frame pieces 22a/b, and/or in first and second flexures 24a/b.

Figure 2B:
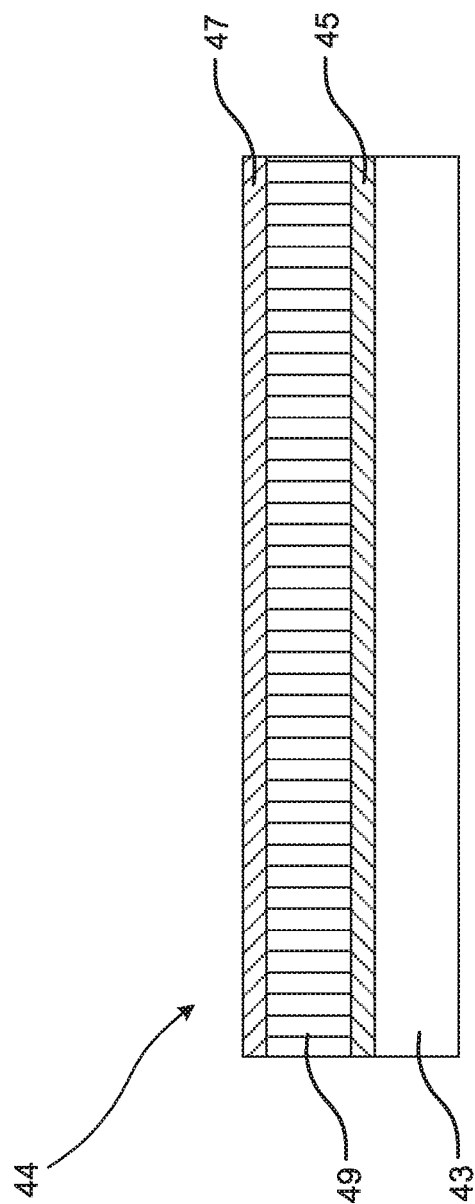
FIG. 2B illustrates a cross-sectional view of a cantilever of the actuator of FIG. 2A in accordance with example embodiments of the disclosed technology.

FIG. 2B illustrates a cross-sectional view of a portion of a cantilever 44 in accordance with example embodiments of the present disclosure. As illustrated in FIG. 2B, cantilever 44 includes first and second conductive layers 45 and 47, and first and second insulating layers 43 and 49. First and second conductive layers 45 and 47 may, in some example implementations, serve as routing layers for electrical signals, and may include poly silicon and/or metal. Insulating layers 43 and 49 may provide structure for first and second conductive layers 45 and 47. In alternative embodiments of cantilever 44, the order of the conductive and insulating layers may be switched such that layers 43 and 49 are conductive layers and layers 45 and 47 are insulating layers.

In one example implementation of cantilever 44, insulating layers 43 and 49 include silicon dioxide, second conductive layer 47 includes metal, and first conductive layer 45 includes polysilicon. In a variant of this example, a coating (e.g., oxide or the like) may cover second conductive layer 47, e.g., to provide insulation against shorting out when coming into contact with another conductor. Second insulating layer 49 may be a thin layer that includes oxide or the like. Additionally, first conductive layer 45, in some instances, may be relatively thick (compared to the other layers of cantilever 44), and may, for example, include silicon, polysilicon, metal, or the like. In such instances, first conductive layer 45 may contribute more than the other layers to the overall characteristics of cantilever 44, including, for example, the nature, degree, or directionality of the flexibility thereof.

Additional embodiments of cantilever 44 (and cantilevers 44a-d) may include additional conductive layers, such that additional electrical signals may be routed via the cantilever 44. In some embodiments, cantilevers 44a-d may be manufactured in a similar fashion to flexures 24a-24b, though the sizing may be different between the two. Moreover, as would be appreciated by one having skill in the art, additional materials may be used to form the various layers of cantilever 44.

In various embodiments, outer cantilevers 44 may be designed to be resistant to shock events (e.g., in the event a device including MEMS actuator 40 is dropped). In such embodiments, each cantilever 44 may be designed such that it i) experiences less displacement stress during shock; ii) experiences less radial stiffness during shock; and iii) withstands a high load without buckling. In some embodiments, outer cantilevers 44 may be designed such that they experience a peak stress of less than about 1900 MPa along their length, and less than about 2100 MPa along their width, in the event of a shock FIGS. 2C-2F illustrate four example designs of shock-resistant outer cantilevers that may be implemented in embodiments of the disclosure.

Figure 2C:
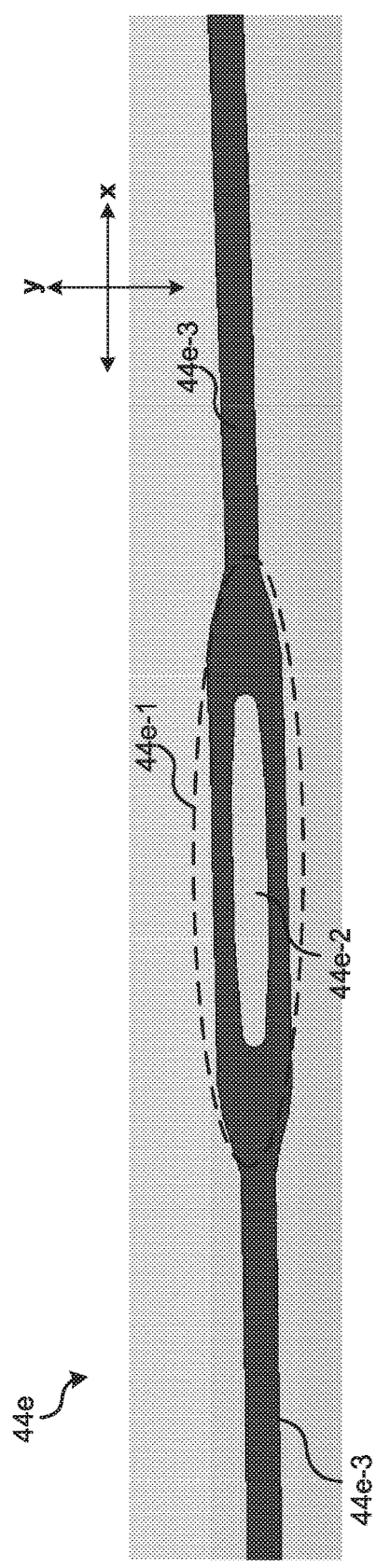
FIG. 2C illustrates a cantilever having a forked junction design that may be implemented in embodiments of the disclosed technology.

FIG. 2C illustrates an outer cantilever 44e having a forked junction design. As shown, cantilever 44e includes a forked junction 44e-1 at its center. The forked-junction 44e-1 at the center includes an aperture 44e-2 and is wider (in Y direction) than the sides 44e-3 of outer cantilever 44e. In various embodiments, the width (in Y direction) of aperture 44e-2 is between 0.02 and 0.04 millimeters, the maximum width of the forked junction 44e-1 is between 0.06 and 0.12 millimeters, and the width of sides 44e-3 is between 0.012 and 0.050 millimeters. In further embodiments, the total length (in X direction) of cantilever 44e is between 4.5 and 7 millimeters. In alternative embodiments, cantilever 44e may include additional forks (and hence apertures) at its center (e.g. 3, 4, etc.).

Figure 2D:
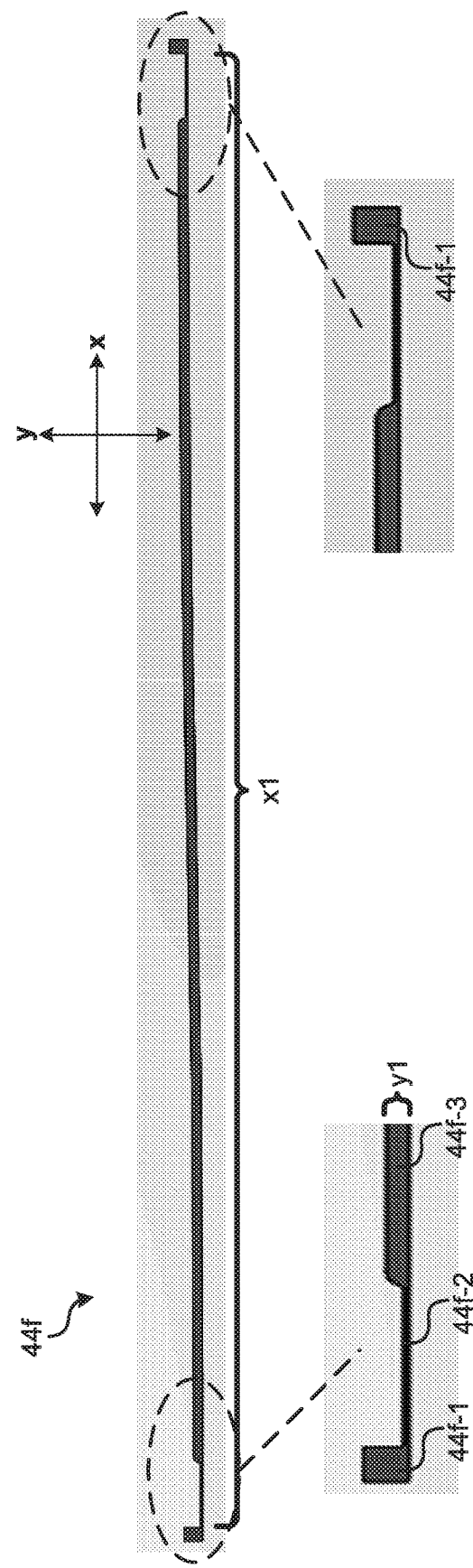
FIG. 2D illustrates a cantilever having an S-shaped design that may be implemented in embodiments of the disclosed technology.

FIG. 2D illustrates an outer cantilever 44f having an S-shaped design. It should be noted that although cantilever 44f primarily appears straight along its length in FIG. 2D, it is curved and has a point of inflection (hence the "S-shape")

along its length that improves resilience in the event of a shock by adding flexibility to cantilever 44f. In this embodiment, the two roots or connecting ends 44f-1 of cantilever 44f couple to a center portion 44f-3 via a thinner portion 44f-2. Cantilever 44f is widest (in Y direction) at its roots 44f-1 and thinnest at the junction 44f-2 between roots 44f-1 and center portion 44f-3. In various embodiments, the total length (x1) of cantilever 44f is between 4.5 and 7 millimeters, and the width (y1) of center portion 44f-3 is between 0.012 and 0.030 millimeters.

Figure 2E:
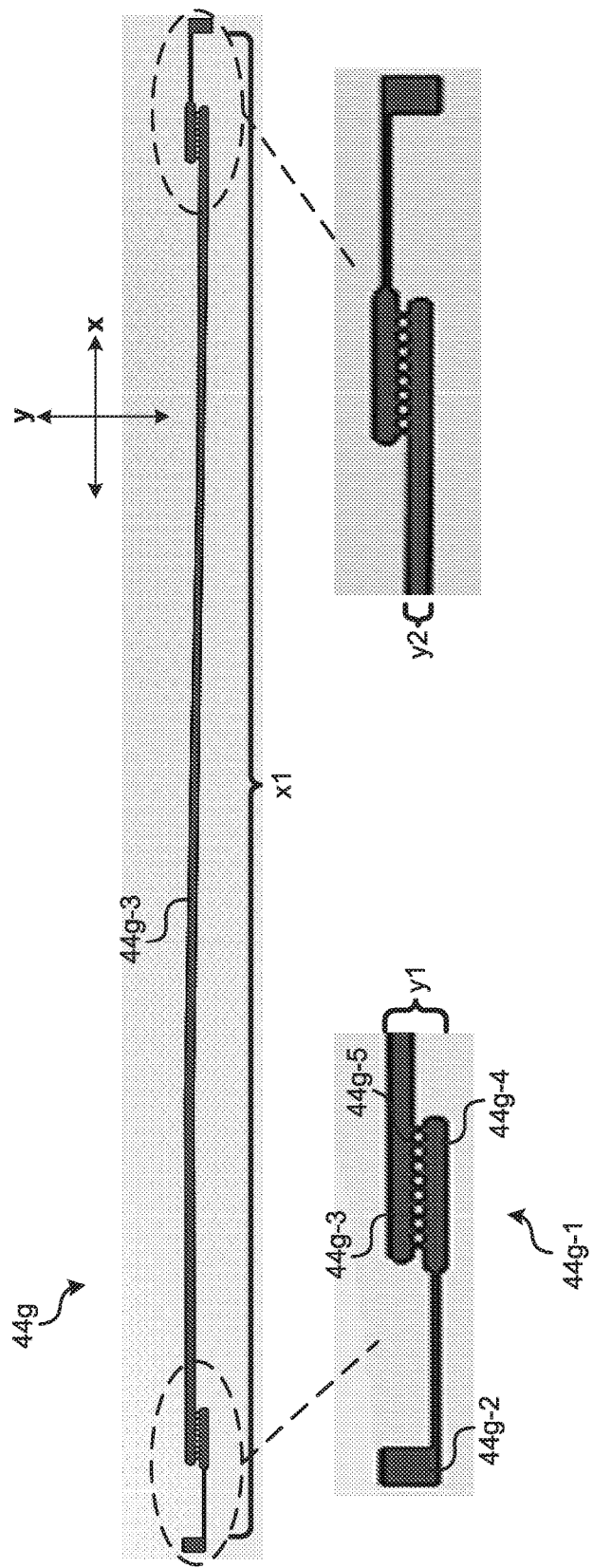
FIG. 2E illustrates a cantilever having an S-shaped design and forked junction that may be implemented in embodiments of the disclosed technology.

FIG. 2E illustrates an outer cantilever 44g having the S-shaped design of cantilever 44f and the added feature of a "toothbrush" shaped or forked junction 44g-1 at each end for relieving stress on cantilever 44g. As illustrated, outer cantilever 44g includes a center portion 44g-3 with ends coupled to end portions 44g-4 that attach to roots 44g-2. In various embodiments, the total length (x1) of cantilever 44g is between 4.5 and 7 millimeters, and the width (y2) of center portion 44g-3 is between 0.012 and 0.030 millimeters.

The forked junction 44g-1 couples each end of center portion 44g-3 to a respective end portion 44g-4 in a direction perpendicular (i.e., Y direction) to the length of cantilever 44g. Each junction 44g-1 includes a plurality of beams 44g-5 that give the junction 44g-1 the appearance of a toothbrush. Although each junction 44g-1 is illustrated as having nine beams 44g-5 in this embodiment, in alternative embodiments the number of beams 44g-5 may be decreased or increased (e.g., from 2 to 12) to improve the performance of cantilever 44g during a shock event (e.g., by reducing peak stress). As illustrated in this particular embodiment, in one junction the end portion 44g-4 is below (Y direction) its corresponding center portion 44g-3, and in the other junction the end portion 44g-4 is above (Y direction) its corresponding center portion 44g-3. Also illustrated in this particular embodiment, the root 44g-2 attached to the end portion 44g-4 below the center portion 44g-3 points upward, whereas the other root 44g-2 points downward. In particular embodiments, the total width (y1) of a forked junction 44g-1, including the end of center portion 44g-3, end portion 44g-4, and beams 44g-5, is between 0.040 and 0.150 millimeters.

Figure 2F:
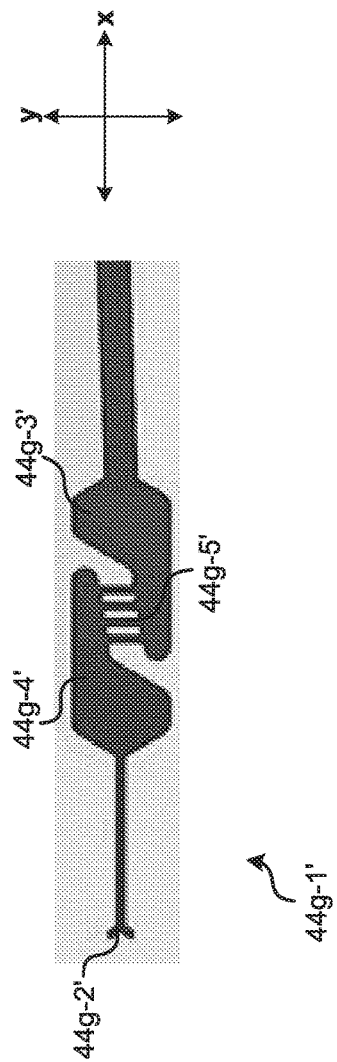
FIG. 2F illustrates an alternative embodiment of a forked junction that may be used in the cantilever of FIG. 2E.

FIG. 2F illustrates an alternative embodiment of a forked junction 44g-1' that may be used in place of forked junction 44g-1 in cantilever 44g to relieve stress. As illustrated in this particular implementation, the end 44g-3' of the center portion of cantilever 44g is tapered along its length (X direction) such that its width (Y direction) decreases in a direction toward root 44g-2'. End 44g-3' attaches to a corresponding tapered end portion 44g-4' that is tapered along its length such that's width decreases in a direction away from root 44g-2'. Because the width (Y direction) of ends 44g-3' and 44g-4' is substantially less along their junction point, this tapered design permits a greater length of beams 44g-5' in a direction roughly perpendicular to cantilever 44g (Y direction). In this embodiment, the root 44g-2' is shaped as a Y junction extending in a direction parallel to cantilever 44g (X direction).

Referring back to FIG. 2A, actuator 40 includes one or more flexures or spring elements 80 connecting inner frame 46 to outer frame 48. Flexures 80 may be electrically conductive and may be soft in all movement degrees of freedom. In various embodiments, flexures 80 route electrical signals between electrical contact pads 82 on outer frame 48 to electrical contact pads 84 on inner frame 46. These electrical signals may subsequently be routed to one or more comb drive actuators 20 through one or more cantilevers 44a-44d. In example implementations, flexures 80 come out from inner frame 46 in one direction, two directions, three directions, or in all four directions.

In one embodiment, actuator 40 is made using MEMS processes such as, for example, photolithography and etching of silicon. Actuator 40, in some cases, moves +/−150 micrometers in plane, and flexures 80 may be designed to tolerate this range of motion without touching one another (e.g., so that separate electrical signals can be routed on the various spring elements 80). For example, flexures 80 may be S-shaped flexures ranging from about 1 to 5 micrometers in thickness, about 2 to 40 micrometers wide, and about 150 to 1000 micrometers by about 150 to 1000 micrometers in the plane.

In order for flexures 80 to conduct electricity well with low resistance, flexures 80 may contain, for example, heavily doped polysilicon, silicon, metal (e.g., aluminum), a combination thereof, or other conductive materials, alloys, and the like. For example, flexures 80 may be made out of polysilicon and coated with a roughly 2000 Angstrom thick metal stack of Aluminum, Nickel, and Gold. In one embodiment, some flexures 80 are designed differently from other flexures 80 in order to control the motion between outer frame 48 and inner frame 46. For example, four to eight (or some other number) of flexures 80 may have a device thickness between about 50 and 250 micrometers. Such a thickness may somewhat restrict out-of-plane movement of outer frame 48 with respect to inner frame 46.

In various embodiments, flexures 80 are low stiffness flexures that operate in a buckled state without failure, thereby allowing the stiffness of the flexures to be several orders of magnitude softer than when operated in a normal state. In these embodiments, a buckled section (i.e., flexible portion) of flexures 80 may be designed such that a cross section of the flexible portion along its direction of bending (i.e., thickness and width) is small, while its length is relatively long. Particular embodiments of flexures 80 are described in greater detail in U.S. patent application Ser. No. 14/677,730 titled "Low Stiffness Flexure", filed Apr. 2, 2015, which is incorporated herein by reference in its entirety.

As noted above with respect to FIG. 2A, a MEMS actuator may be designed with an outer frame 48 coupled to an inner frame 46 by a plurality of buckled flexures 80. During operation, inner frame 46 may collide with outer frame 48 in the event of a sudden shock. Accordingly, in embodiments, shock stops may be included in the outer and inner frames to protect the MEMS actuator structure in the event of shock.

Figure 3A:
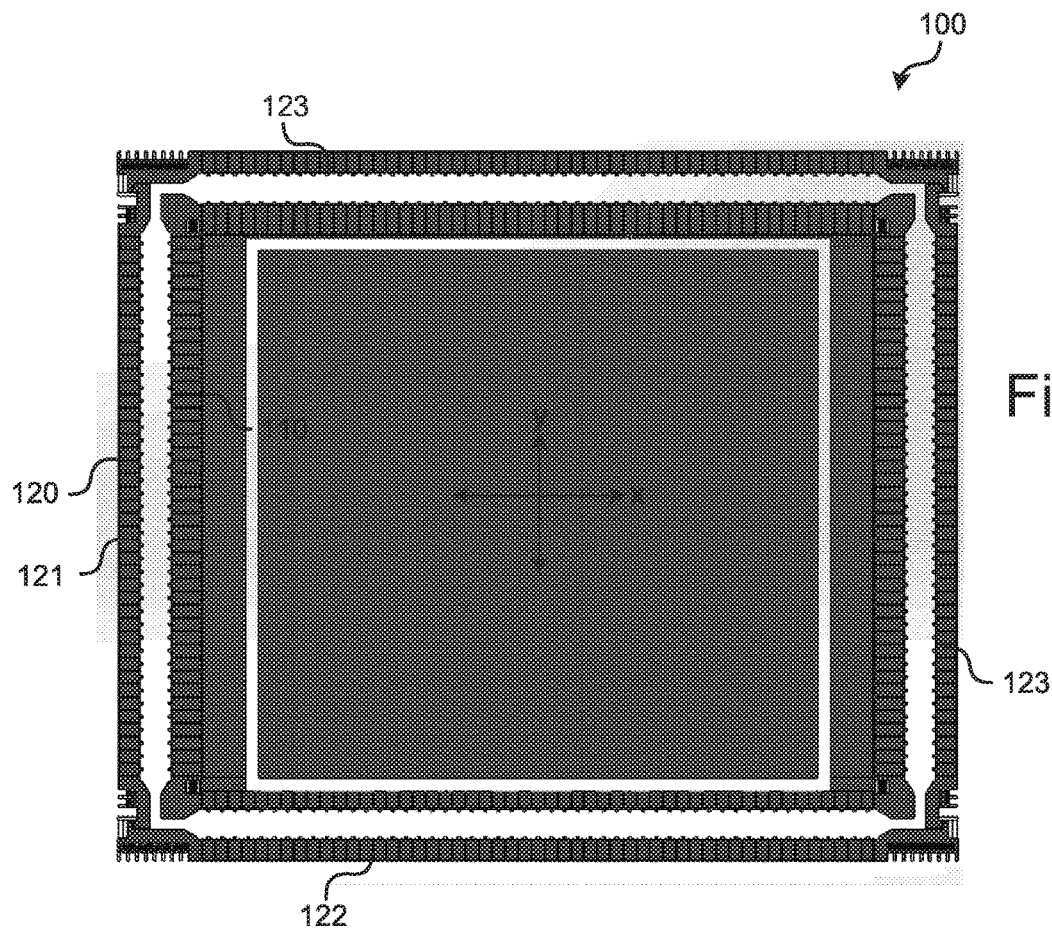
FIG. 3A illustrates an example MEMS actuator including an outer frame, inner frame, and shock stops in accordance with the disclosed technology.
Figure 3B:
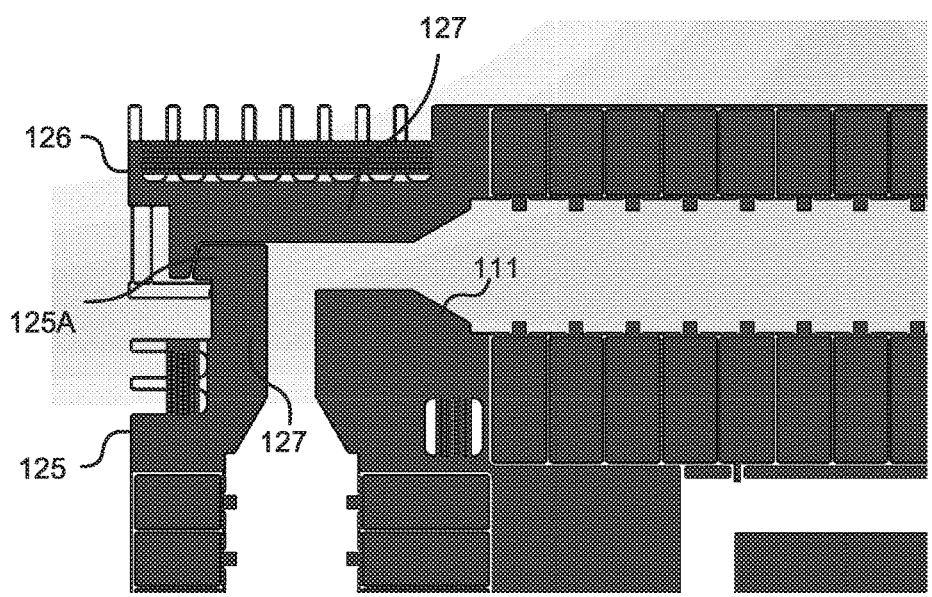
FIG. 3B is a magnified view of the latching mechanisms and shock stops of the MEMS actuator of FIG. 3A.

FIGS. 3A-3B illustrate one such embodiment of a MEMS actuator 100 including shock stops. As illustrated in this particular embodiment, MEMS actuator 100 comprises an inner frame 110 coupled to an outer frame 120 by a plurality of buckled flexures (not pictured). Outer frame 120 includes four latched electrical bars 121-124. As illustrated, for each of the connections between the latched bars 121-124, a latch protrusion 125A of a latching mechanism 125 is engaged with a respective groove of a latching mechanism 126, thereby securing the electrical bars 121-124 together. Particular methods of latching an outer frame structure of a MEMS actuator during assembly of the MEMS actuator are described in greater detail in U.S. patent application Ser. No. 14/819,413 titled "Electrical Bar Latching for Low Stiffness Flexure MEMS Actuator", filed Aug. 5, 2015, which is incorporated herein by reference in its entirety.

Also, illustrated in FIGS. 3A-3B is a pair of shock stops 127 and 111 corresponding to outer frame 120 and inner frame 110, respectively. In this particular embodiment of actuator 100, four pairs of shock stops 127 and 111 (one for each corner) are present to absorb shock collisions between outer frame 120 and inner frame 110 in the event of a shock. However, as would be appreciated by one having skill in the art, any number of shock stop pairs could be implemented in alternative implementations of a MEMS actuator or other MEMS device that experiences collisions between two portions of the device.

In various embodiments, shock stops 127 and 111 may be designed to maximize the amount of kinetic energy they can absorb upon impact (e.g., when horizontal or vertical stop 127 collides with stop 111) due to a shocking event without experiencing permanent deformation. For example, in embodiments shock stops 127 and 111 may be designed to absorb a combined kinetic energy of between 100 and 400 μJ. In particular embodiments, shock stops 127 and 111 may absorb a combined kinetic energy of between 300 and 400 μJ.

Figure 3C:
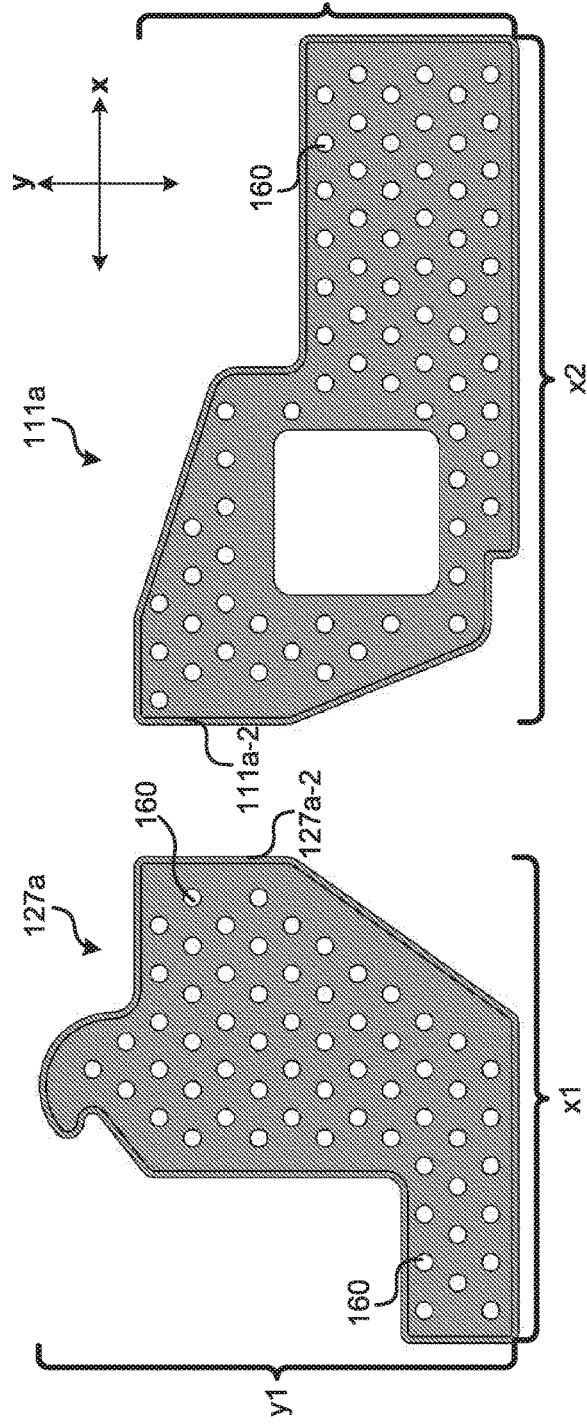
FIG. 3C illustrates a pair of shock stops that may be implemented in embodiments of the disclosed technology.
Figure 3D:
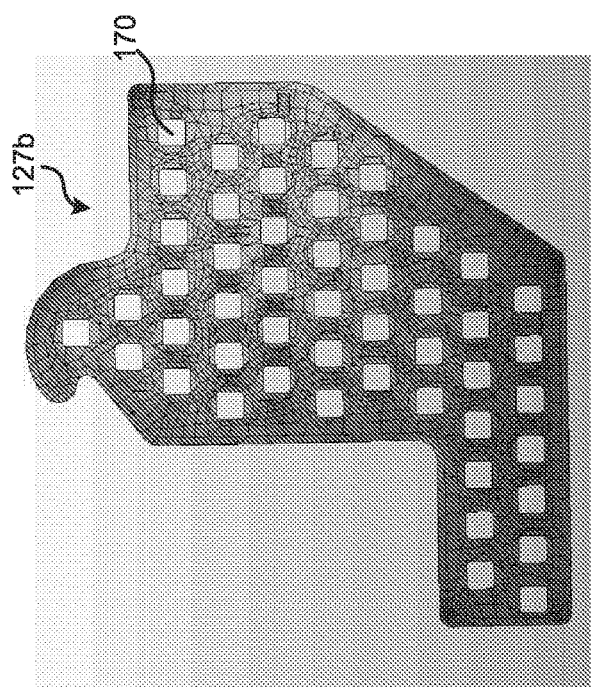
FIG. 3D illustrates a shock stop that may be implemented in embodiments of the disclosed technology.

FIGS. 3C-3D illustrates two exemplary designs of shock stops 127 and 111 that may be implemented in embodiments of the technology disclosed herein. FIG. 3C illustrates shock stops 127a and 111a comprising a plurality of circular, staggered apertures 160. In the event of a shock, surface 127a-2 of stop 127a contacts surface 111a-2 of shock 111a. As illustrated in this particular embodiment, the apertures 160 are spaced apart in a concentrated, hexagonal pattern. In various embodiments, the diameters of the circular apertures may be between 0.010 and 0.022 millimeters. In particular embodiments, the diameter of the circular apertures is about 16 um. In particular embodiments, shock stops 127a and 111a may absorb a combined energy of about 350 μJ and each deform up to about 40 μm before breaking. In alternative implementations of shock stops 127a and 11a, apertures 160 may be filled with epoxy glue to adjust their stiffness and/or arranged in a different pattern (e.g., triangular, rectangular, linear, or other pattern). In various embodiments, the total length ($x_1$) of shock stop 127a is between 0.250 and 1.000 millimeters, and the total width ($y_1$) of shock stop 127a is between 0.0250 and 1.000 millimeters. In various embodiments, the total length ($x_2$) of shock stop 111a is between 0.300 and 1.200 millimeters, and the total width ($y_2$) of shock stop 111a is between 0.0250 and 1.000 millimeters.

FIG. 3D illustrates a shock stop 127b comprising a plurality of square, staggered apertures 170. Although a second corresponding shock stop is not illustrated in the example of FIG. 3D, it would be understood by one having skill in the art that the same features of shock stop 127b could be implemented in the corresponding shock stop. Similar to FIG. 3C, the apertures 170 are spaced apart in a concentrated, hexagonal pattern. In particular embodiments, shock stop 127b and a corresponding shock stop may absorb a combined energy of about 300 μJ and each deform up to about 15 μm before breaking. In alternative implementations of shock stop 127b, apertures 170 may be filled with epoxy glue to adjust their stiffness and/or arranged in a different pattern (e.g., triangular, rectangular, linear, or other pattern).

In yet further embodiments of the technology disclosed herein, other alternative shock stop designs may be implemented to tune the maximum energy they can absorb and the maximum amount of distance they may displace without breaking. For example, horizontal or vertical slits may be used instead of or in combination with the aforementioned apertures.

Figure 4:
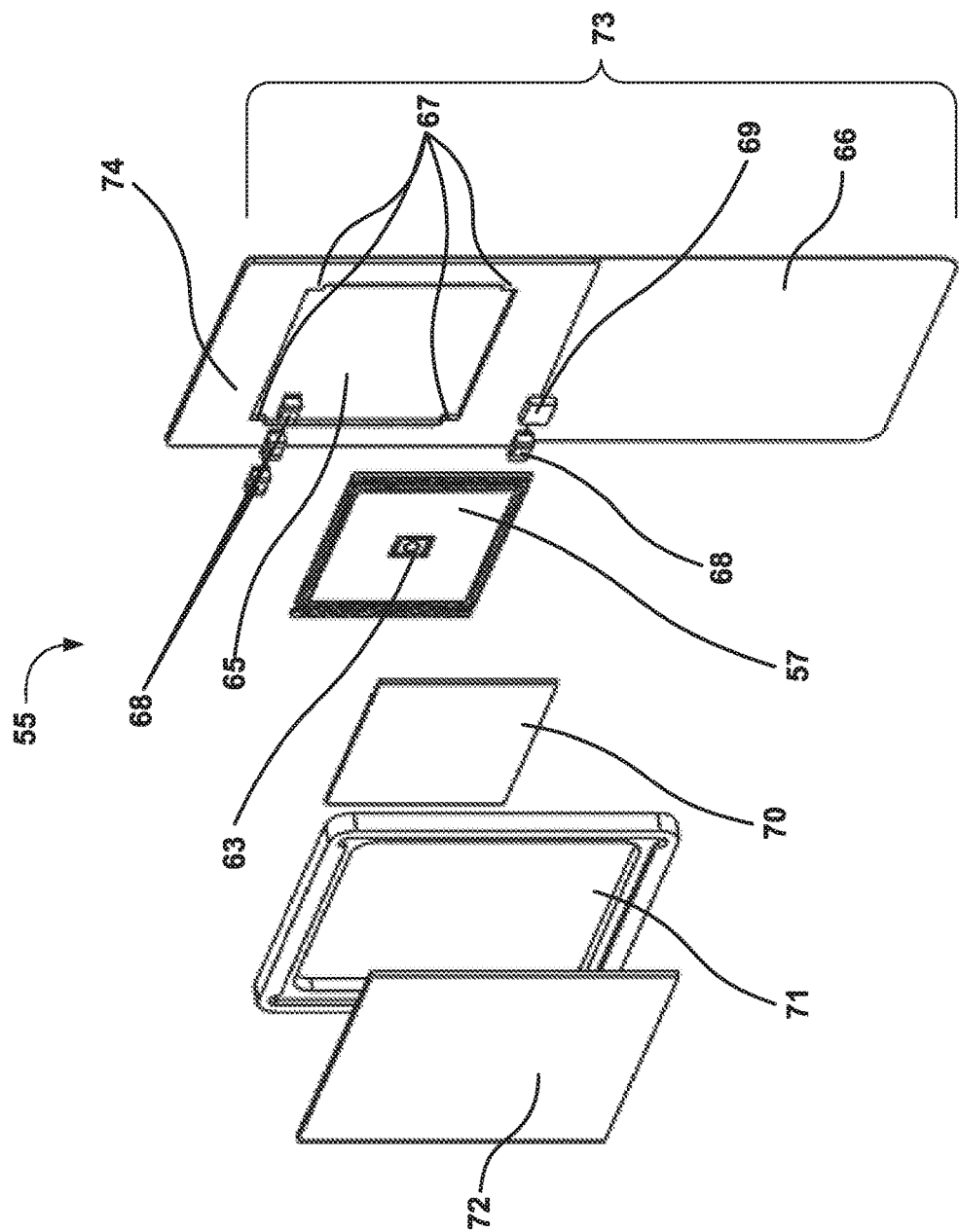
FIG. 4 is an exploded perspective view of an example image sensor package utilized in accordance with various embodiments of the disclosed technology.

FIG. 4 is an exploded perspective view illustrating an assembled moving image sensor package 55 that may use the actuators described herein in accordance with one embodiment of the technology disclosed herein. Moving image sensor package 55 can include, but is not limited to the following components: a substrate 73; a plurality of capacitors or other passive electrical components 68; a MEMS actuator driver 69; a MEMS actuator 57; an image sensor 70; an image sensor cap 71; and an infrared (IR) cut filter 72. Substrate 73 can include a rigid circuit board 74 with an opening 65 and in-plane movement limiting features 67, and a flexible circuit board acting as a back plate 66. The rigid circuit board 74 may be constructed out of ceramic or composite materials such as those used in the manufacture of plain circuit boards (PCB), or some other appropriate material(s). Moving image sensor package 15 may include one or more drivers 69.

Since the thermal conduction of air is roughly inversely proportional to the gap, and the image sensor 70 can dissipate a substantial amount of power between 100 mW and 1 W, the gaps between the image sensor 30, the stationary portions of the MEMS actuator 57, the moving portions of the MEMS actuator 57, and the back plate 66 are maintained at less than approximately 50 micrometers. In one embodiment, the back plate 66 can be manufactured out of a material with good thermal conduction, such as copper, to further improve the heat sinking of the image sensor 70. In one embodiment, the back plate 66 has a thickness of approximately 50 to 100 micrometers, and the rigid circuit board 74 has a thickness of approximately 150 to 200 micrometers.

While various embodiments of the present invention have been described above, it should be understood that they have been presented by way of example only, and not of limitation. Likewise, the various diagrams may depict an example architectural or other configuration for the invention, which is done to aid in understanding the features and functionality that can be included in the invention. The invention is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the present invention. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the invention is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the invention, whether or not such embodiments are described and whether or not such features are presented as being a part of a described embodiment. Thus, the breadth and scope of the present invention should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. A motion control flexure for a microelectromechanical systems (MEMS) device, comprising:
    a rod comprising a first and second end, wherein the rod is tapered along its length such that it is widest at its center and thinnest at its ends;
    a first hinge directly coupled to the first end of the rod; and
    a second hinge directly coupled to the second end of the rod, wherein the first and second hinges are each coupled to a respective frame of a MEMS actuator.

2. The motion control flexure of claim 1, wherein the rod is between 1 and 4 mm long and between 10 and 70 μm wide.

3. The motion control flexure of claim 2, wherein each of the first and second hinges is between 0.05 and 0.3 mm long and between 1 and 10 μm wide.

4. The motion control flexure of claim 3, wherein the motion control flexure is rigid in a direction along its length and flexible in a direction perpendicular to its length.

5. The motion control flexure of claim 2, wherein the rod is about 50 μm wide at is center and about 35 μm wide at its first and second ends.

* * * * *